(12) United States Patent
Koyamada et al.

(10) Patent No.: US 11,515,561 B2
(45) Date of Patent: Nov. 29, 2022

(54) SECONDARY BATTERY SYSTEM AND SECONDARY BATTERY CONTROL METHOD

(71) Applicant: Toyota Jidosha Kabushiki Kaisha, Toyota (JP)

(72) Inventors: Kohei Koyamada, Susono (JP); Masafumi Nose, Susono (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 931 days.

(21) Appl. No.: 16/351,941

(22) Filed: Mar. 13, 2019

(65) Prior Publication Data

US 2019/0288329 A1 Sep. 19, 2019

(30) Foreign Application Priority Data

Mar. 16, 2018 (JP) .............................. JP2018-049245

(51) Int. Cl.
*H01M 10/04* (2006.01)
*H01M 10/0525* (2010.01)
*H01M 10/44* (2006.01)
*H02J 7/00* (2006.01)
*G01R 31/382* (2019.01)

(52) U.S. Cl.
CPC ........ *H01M 10/044* (2013.01); *G01R 31/382* (2019.01); *H01M 10/0525* (2013.01); *H01M 10/441* (2013.01); *H02J 7/005* (2020.01); *H02J 7/0014* (2013.01); *H02J 7/0029* (2013.01)

(58) Field of Classification Search
CPC ........... H01M 10/0525; H01M 10/441; H01M 10/044; H01M 10/482; H01M 10/486; H01M 10/052; H01M 10/4207; H01M 10/4285; G01R 31/382; H02J 7/0014; H02J 7/0021; H02J 7/0063; H02J 7/007; H02J 2007/0067; H02J 7/0029; H02J 7/005; H02J 7/0069; H02J 7/0036; H02J 2007/0037; Y02E 60/10; Y02P 70/50
See application file for complete search history.

(56) References Cited

U.S. PATENT DOCUMENTS

| | | | | |
|---|---|---|---|---|
| 11,054,483 | B2* | 7/2021 | Chen | ..................... H02J 7/0029 |
| 2003/0146737 | A1* | 8/2003 | Kadouchi | ............... B60L 58/14 |
| | | | | 320/132 |
| 2010/0253284 | A1* | 10/2010 | Aoki | ................... H01M 10/441 |
| | | | | 320/136 |
| 2014/0239908 | A1 | 8/2014 | Ichikawa et al. | |

(Continued)

FOREIGN PATENT DOCUMENTS

JP 2014166015 A 9/2014

*Primary Examiner* — Nha T Nguyen
(74) *Attorney, Agent, or Firm* — Dinsmore & Shohl LLP

(57) ABSTRACT

A secondary battery system and a secondary battery control method, wherein the system and the method include a plurality of unit cells connected in series, and a recovery charging controller that performs recovery charging of charging the plurality of unit cells while generating a micro short-circuit in at least one of the plurality of unit cells by charging the plurality of unit cells at a predetermined recovery charging current value which is higher than a upper limit current value during normal charging, wherein the unit cells are all-solid-state lithium secondary battery unit cells.

10 Claims, 8 Drawing Sheets

(56) References Cited

U.S. PATENT DOCUMENTS

| | | | |
|---|---|---|---|
| 2015/0004443 A1* | 1/2015 | Iwase | H01M 10/4235 |
| | | | 429/49 |
| 2018/0026471 A1* | 1/2018 | Lu | H02J 7/0029 |
| | | | 320/134 |
| 2018/0097261 A1* | 4/2018 | Kuwabara | H01M 10/0525 |
| 2018/0097262 A1* | 4/2018 | Kuwabara | H01M 10/425 |
| 2018/0172772 A1* | 6/2018 | Yuan | H02J 7/0068 |
| 2019/0219640 A1* | 7/2019 | Liu | G01R 31/36 |
| 2019/0252720 A1* | 8/2019 | Sato | H01M 4/136 |
| 2019/0305384 A1* | 10/2019 | Liu | H01M 10/48 |
| 2019/0353693 A1* | 11/2019 | Yang | H01M 10/44 |
| 2020/0355749 A1* | 11/2020 | Takahashi | G01R 19/16576 |
| 2021/0005939 A1* | 1/2021 | Tajima | B60L 3/0046 |
| 2021/0288357 A1* | 9/2021 | Kuriki | H02J 7/0048 |
| 2022/0158260 A1* | 5/2022 | Choi | H01M 10/4242 |

* cited by examiner

FIG. 1
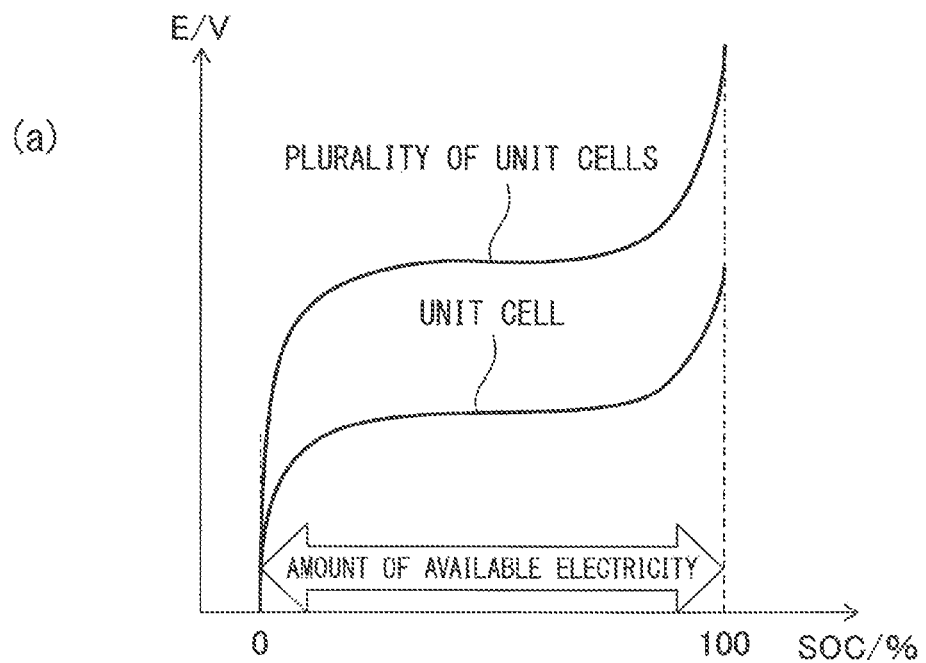
(a)
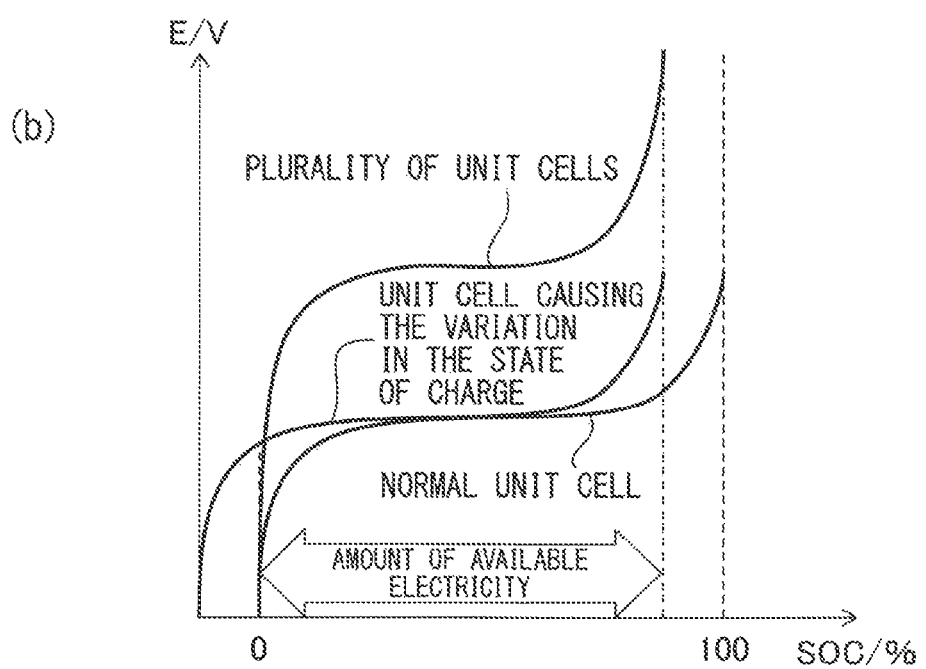
(b)

SECONDARY BATTERY SYSTEM AND SECONDARY BATTERY CONTROL METHOD

CROSS-REFERENCE TO RELATED APPLICATIONS

The present application claims priority to Japanese Patent Application No. 2018-049245 filed on Mar. 16, 2018, the entire contents of which are hereby incorporated by reference.

FIELD

The present disclosure relates to a secondary battery system and a secondary battery control method.

BACKGROUND

For charging and discharging at high voltages, secondary battery systems including a plurality of unit cells connected in series are used.

In such secondary battery systems, it is known that When difference (variation) in the state of charge (SOC) between the plurality of unit cells constituting the secondary battery system occurs, the amount of available electricity decreases.

For example, FIG. 1 is an image showing the reduction in the amount of available electricity due to the variation in the state of charge between the plurality of unit cells. FIG. 1(a) is an image showing the case in which there is no variation in the state of charge between the plurality of unit cells and FIG. 1(b) is an image showing the case in which there is a variation in the state of charge between the plurality of unit cells (for example, the case in which there is one unit cell causing the variation in the state of charge). When FIG. 1(a) and FIG. 1(b) are compared with, each other, it can be understood that when there is a variation in the state of charge between the plurality of unit cells, the amount of available electricity decreases.

Regarding such a problem, Patent Literature 1 provides a stationary power storage system capable of suppressing degradation in the performance of a stationary storage battery due to the variation in the state of charge among a plurality of nickel-hydrogen secondary batteries constituting the stationary storage battery. In the system of Patent Literature 1, the variation in tho state of charge between the plurality of nickel-hydrogen secondary batteries are eliminated by utilizing the water generation reaction which occurs during overcharging of the nickel-hydrogen secondary battery.

CITATION LIST

Patent Literature

[PTL 1] Japanese. Unexamined Patent Publication (Kokai) No. 2014-166015

SUMMARY

Technical Problem

The system of Patent Literature 1 utilizes the water generation reaction which occurs during overcharging of the nickel-hydrogen secondary battery, whereby the variation in the state of charge between the plurality of nickel-hydrogen secondary batteries are eliminated. Thus, the system of Patent Literature 1 cannot be applied to a secondary battery system having a plurality of unit cells. Furthermore, the system of Patent Literature 1 cannot be applied to an all-solid-state lithium secondary battery due to the type of reaction used.

Thus, in the present disclosure, provided are a secondary battery system and a secondary battery control method which can minimize or eliminate the variation in state of charge between a plurality of unit cells connected in series.

Solution to Problem

The present inventors have discovered that the above problems can be solved by the following aspects.

Aspect 1

A secondary battery system,
wherein the system comprises:
a plurality of unit cells connected in series, and
a recovery charging controller that performs recovery charging of charging the plurality of unit cells while generating a micro short-circuit in at least one of the plurality of unit cells by charging the plurality of unit cells at a predetermined recovery charging current value which is higher than a upper limit current value during normal charging, and wherein the unit cells are all-solid-state lithium secondary battery unit cells.

Aspect 2

The secondary battery system according to Aspect 1,
wherein the system comprises a voltage value acquisition part for acquiring a total voltage value of the plurality of unit cells, and
wherein during the recovery charging, when the total voltage value becomes higher than a predetermined first voltage value, the recovery charging controller decreases the recovery charging current value, and when the total voltage value becomes lower than a predetermined second voltage value, the recovery charging controller increases the recovery charging current value, where by the recovery charging is maintained.

Aspect 3

The secondary battery system according to Aspect 2,
wherein the system further comprises a short-circuit determination part for determining whether if a short-circuit has been generated in the plurality of unit cells, and
wherein after the recovery charging controller has increased the recovery charging current value, the voltage value acquisition part acquires a total voltage value of the plurality of unit cells after the increase in recovery current value, and
wherein when the total voltage value after the increase in recovery current value is equal to or lower than the predetermined second voltage value, the short-circuit determination part determines that a short-circuit has been generated in at least one of the plurality of unit cells.

Aspect 4

The secondary battery system according to any one of Aspects 1 to 3,
  wherein the system further comprises:
  a voltage value acquisition part, a current value acquisition part, and a temperature acquisition part for acquiring a total voltage value, a current value, and a temperature of the plurality of unit cells, respectively, and
  an operation part for calculating a total actual discharge capacity of the plurality of unit cells from the voltage value, the current value, and the temperature, and
  wherein when the total actual discharge capacity becomes lower than a predetermined value, the controller performs the recovery charging.

Aspect 5

The secondary battery system according to Aspect 4,
  wherein, the system further comprises a degradation determination part for determining degradation of the plurality of unit cells,
  wherein after recovery charging has been, performed, the operation part calculates a total actual discharge capacity of the plurality of unit cells after recovery charging, and
  wherein when the difference between the total actual discharge capacity after the recovery charging and the total actual discharge capacity before the recovery charging is lower than a predetermined value, the degradation determination part determines that at least one of the plurality of unit cells has degraded.

Aspect 6

The secondary battery system according to any one of Aspects 1 to 5, wherein the plurality of unit cells connected in series form a bipolar-type laminated battery.

Aspect 7

A secondary battery control method,
  wherein the method comprises:
  performing recovery charging of charging the plurality of unit cells connected in series, while generating a micro short-circuit in at least one of the plurality of unit cells by charging, the plurality of unit cells, at a predetermined recovery charging current value which is higher than a upper limit current value during normal charging, and
  wherein the unit cells are all-solid-state lithium secondary battery unit cells.

Aspect 8

The method according to Aspect 7, further comprising:
acquiring a total voltage value of the plurality of unit cells, and
maintaining the recovery charging by, during the recovery charging, decreasing the recovery charging current value when the total voltage value becomes higher than a predetermined first voltage value, and increasing the recovery charging current value when the total voltage value becomes lower than a predetermined second voltage value.

Aspect 9

The method according to Aspect 8, further comprising:
acquiring, after the recovery charging current has been increased, a total voltage value of the plurality of unit cells after the increase in recovery current value, and
determining that a short-circuit has been generated in at least one of the plurality of unit cells when the total voltage value after the increase in recovery current value is equal to or lower than the predetermined second voltage value.

Aspect 10

The method according to any one of Aspects 7 to 9, further comprising:
acquiring a total voltage value, a current value, and a temperature of the plurality of unit cells, respectively,
calculating a total actual discharge capacity of the plurality of unit cells from the voltage value, the current value, and the temperature, and
performing the recovery charging when the total actual discharge capacity becomes lower than a predetermined value.

Aspect 11

The method according to Aspect 10, further comprising:
calculating, after the recovery charging has been performed, a total actual discharge capacity for the plurality of unit cells after recovery charging, and
determining that at least one of the plurality of unit cells has degraded when the difference between the total actual discharge capacity after the recovery charging, and the total actual discharge capacity before the recovery charging is lower than a predetermined value.

Aspect 12

The method according to any one of Aspects 7 to 11, wherein the plurality of unit cells connected in series, form a bipolar-type laminated battery.

Effects of Present Disclosure

According to the secondary battery system and secondary battery control method of the present disclosure, the variation in the state of charge between the plurality of unit cells connected in series can be minimized or eliminated.

BRIEF DESCRIPTION OF DRAWINGS

FIG. 1 is an image showing a reduction in the amount of available electricity due to the variation in the state of char ee between a plurality of unit cells.

DESCRIPTION OF EMBODIMENTS

The embodiments of the present disclosure will be described in detail below. Note that the present disclosure is not limited to the following embodiments and various modifications can be made within the scope of the gist of the present disclosure.

«Secondary Battery System and Secondary Battery Control Method»

The secondary battery system of the present disclosure comprises:
 a plurality of unit cells connected in series, and
 a recovery charging controller that performs recovery charging of charging the plurality of unit cells, while generating a micro short-circuit in at least one of the plurality of unit cells by charging the plurality of unit cells, at a predetermined recovery charging current value which is higher than a upper limit current value during normal charging.

The secondary battery control method of the present disclosure comprises:
 performing recovery charging of charging the plurality of unit cells connected in series, while generating a micro short-circuit in at least one of the plurality of unit cells by charging the plurality of unit cells, at a predetermined recovery charging current value which is higher than a upper limit current value during normal charging.

Note that in the secondary battery system and the secondary battery control method of the present disclosure, the unit cells are all-solid-state lithium secondary battery unit cells.

Figure 2:
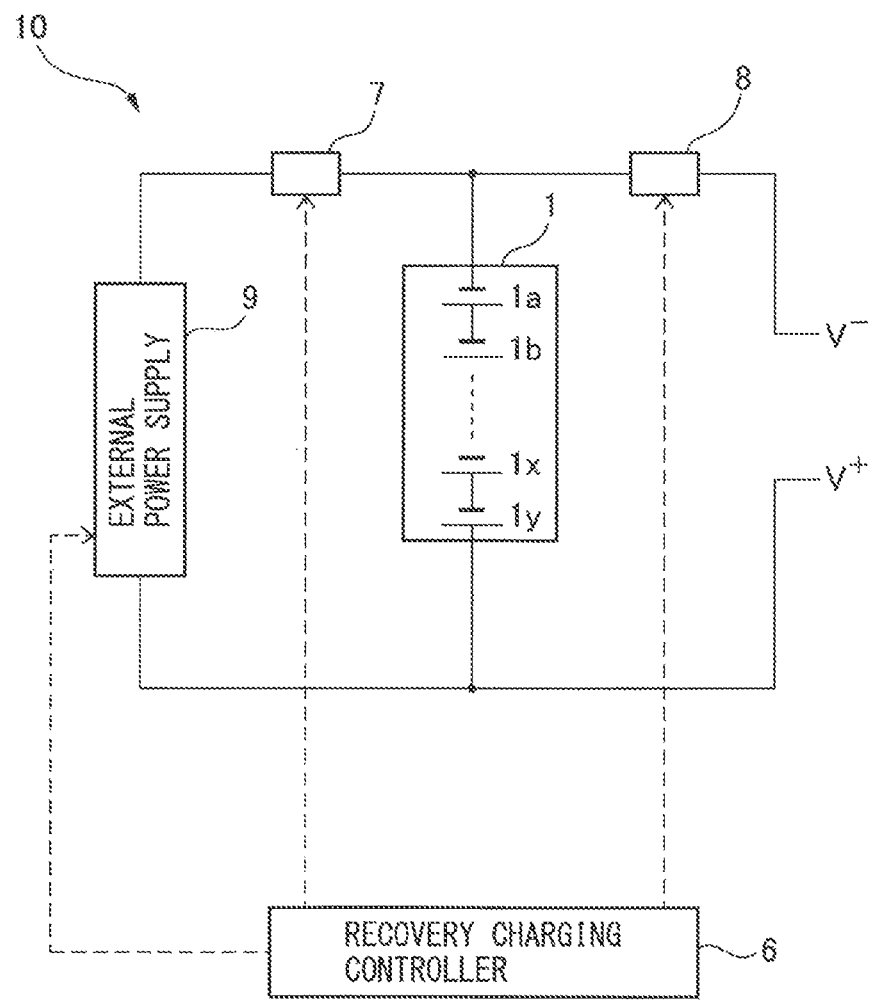
FIG. 2 is a schematic view showing an embodiment of the configuration of the secondary battery system of the present disclosure.

FIG. 2 is a schematic view showing an embodiment of the configuration of the secondary battery system of the present disclosure. As shown in FIG. 2, the secondary battery system 10 of the present disclosure comprises lithium secondary batteries 1 composed of a plurality of unit cells 1a, 1b, . . . , 1x, and 1y connected in series, and a recovery charging controller 6 that performs recovery charging of charging the plurality of unit cells while generating a micro short-circuit in at least one of the all-solid-state lithium secondary battery 1 by charging the all-solid-state lithium secondary battery 1 at a predetermined recovery charging current value which is higher than a upper limit current value during normal charging.

Note that, in the present disclosure, "micro short-circuit" means a short-circuit generated between the positive electrode active material layer and the negative electrode active material layer by metallic lithium deposited during the charging of the unit cells followed by flowing through the solid electrolyte layer, whereby the positive electrode active material layer and the negative electrode active material layer become electrically connected, wherein after charging is completed, for example, the deposited metal lithium is consumed due to the reaction of the deposited lithium metal with the positive electrode active material after the charging reaction, whereby the short-circuit disappear, and wherein the usage of the all-solid-state lithium secondary battery is not impaired. This "micro short-circuit" is generated by charging the plurality of unit cells at a predetermined recovery charging current value which is higher than the upper limit current value at the time of normal charging. Furthermore, the generation of this "Micro short-circuit" can be determined by the oscillation of the total voltage when charging at, for example, a constant current. The voltage oscillation is caused by repeated growth and disappearance of the micro short-circuit during recovery charging, and can be expressed as the fluctuation between positive and negative values in the voltage change amount per unit time ($\Delta V/\Delta t$). Furthermore, the "voltage change amount per unit time ($\Delta V/\Delta t$)" can be obtained from the expression $(v2-v1)/(t2-t1)$ when the total voltage value observed at a first time t1 is v1 and the total voltage value observed at a second time t2 is v2.

Furthermore, recovery charging is not particularly limited and can be performed by, for example, electric power supplied from an external power supply. Moreover, when the plurality of unit cells are installed in a vehicle, such as a hybrid vehicle or an electric vehicle, recovery charging in which the plurality of unit cells are charged can be performed, at the time of, for example, vehicle inspection.

Specifically, as shown in, for example, FIG. 2, the recovery charging controller 6 can perform recovery charging in which the plurality of unit cells are charged while generating micro short-circuit in at least one of the plurality of unit cells 1a, 1b, . . . , 1x, and 1y of the all-solid-state lithium secondary battery 1 by switching off a switch 8 between the all-solid-state lithium secondary battery 1 and the load (for example, power consuming equipment) and by switching on a switch 7 between the all-solid-state lithium secondary battery 1 and the external power supply 9.

Furthermore, in some embodiments the secondary battery system and secondary battery control method of the present disclosure comprise a voltage value acquisition part for acquiring the total voltage value (V) of the plurality of unit cells, wherein during the recovery charging, when the total voltage value (V) becomes higher than the predetermined first voltage value ($V_1$), the recovery charging controller decreases the recovery charging current value, and when the total voltage value (V) becomes lower than the predetermined second voltage value ($V_2$), the recovery charging controller increases the recovery charging current, value, whereby the recovery charging is maintained. The reason for this will be considered as follows.

In particular, in the secondary battery system and secondary battery control method of the present disclosure, during recovery charging, when the total voltage value (V) of the plurality of unit cells becomes higher than the predetermined first voltage value ($V_1$), the recovery charging controller decreases the recovery charging current value, whereby it is possible to prevent the aforementioned micro short-circuit from growing excessively. Furthermore, during recovery charging, when the total voltage value (V) of the plurality of unit cells becomes lower than the predetermined second voltage value ($V_2$), the recovery charging current value is increased and recovery charging is maintained, whereby it is possible to prevent the micro short-circuit from becoming excessively small and to prevent inhibition of performance of the recovery charging.

Figure 3:
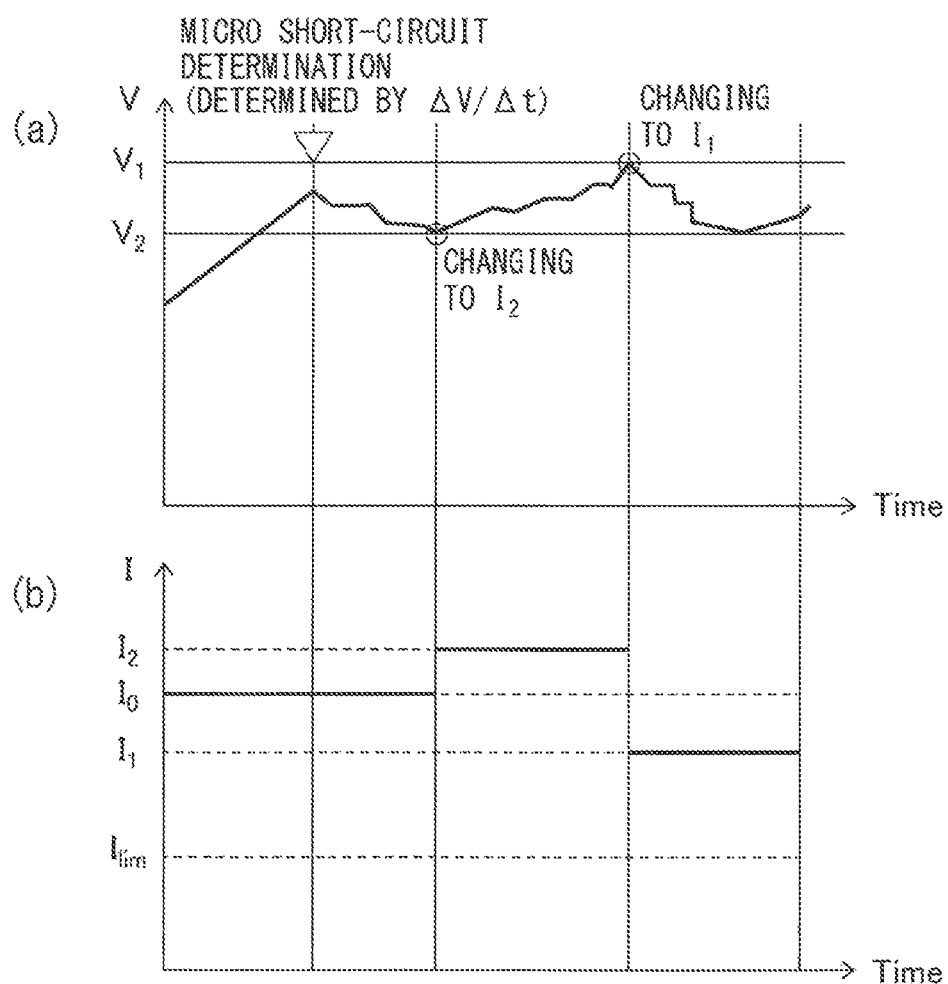
FIG. 3 is an image of control according to an embodiment of the secondary battery system and secondary battery control method of the present disclosure.

For example, FIG. 3 is an image of control according to the above embodiment of the secondary battery system and secondary battery control method of the present disclosure. As shown in FIG. 3(b), when the plurality of unit cells are charged at a predetermined recovery charging current value ($I_0$), which is higher than a upper limit current value ($I_{lim}$) during normal charging, the total voltage value (V) of the plurality of unit cells increases. At this time, when the voltage change amount per unit time (ΔV/Δt) fluctuates between positive and negative values, it can be determined that the micro short-circuit has been generated.

In the secondary battery system and secondary battery control method of the present disclosure, the micro short-circuit may be stabilized in some embodiments. In other words, as shown in FIG. 3(a), in some embodiments the total voltage of the plurality of unit cells may be controlled between the predetermined first voltage value ($V_1$) and the predetermined second voltage value ($V_2$) so that the voltage change amount (ΔV/Δt) fluctuates between positive and negative values. Thus, if the total voltage value (V) of the plurality of unit cells becomes lower than the predetermined second voltage value ($V_2$), the recovery charging current value may be increased to a second current value ($I_2$), whereby recovery charging is maintained. Conversely, if the voltage value (V) becomes higher than the predetermined first voltage value ($V_1$), the recovery charging current value may be decreased to a first current value ($I_1$), whereby recovery charging is maintained. Provided that it satisfies $I_{lim} < I_1 < I_0 < I_2$.

The above embodiment of the present disclosure will be explained in more detail below using the flowchart shown in FIG. 4.

Figure 4:
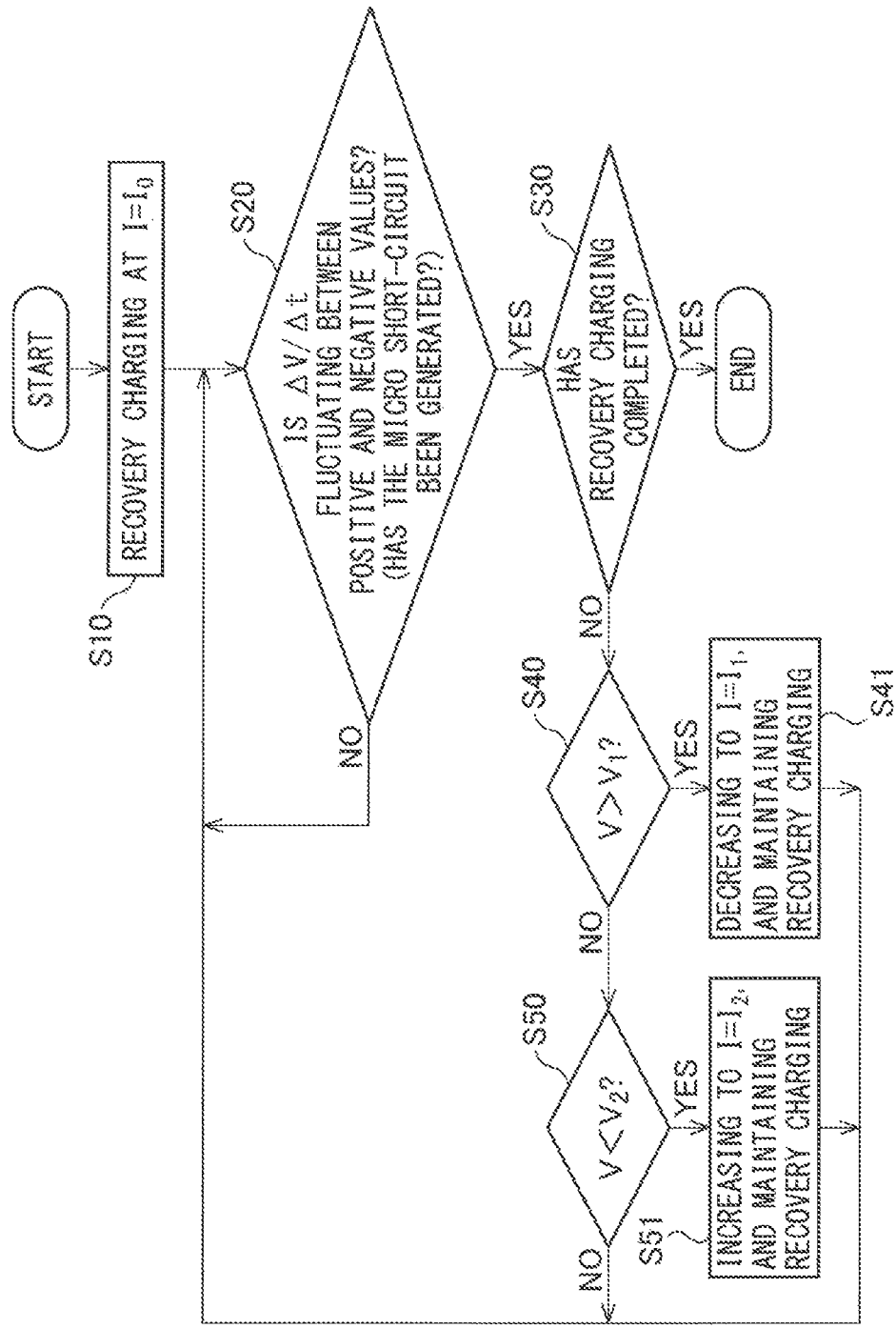
FIG. 4 is a flowchart showing an embodiment of the secondary battery system and secondary battery control method of the present disclosure.

FIG. 4 is a flowchart showing an embodiment of the secondary battery system and secondary battery control method of the present disclosure.

As shown in FIG. 4, after use of the secondary battery system or the secondary battery control method of the present disclosure has started, the plurality of unit cells are recovery charged at the predetermined recovery charging current value ($I_0$) which is higher than the upper limit current value ($I_{lim}$) during normal charging (S10). The upper limit current value ($I_{lim}$) during normal charging and the predetermined recovery charging current value ($I_0$) can be appropriately set in accordance with the specifications of the target plurality of unit cells.

By performing recovery charging, the total voltage value of the plurality of unit cells is increased. The total voltage value (V) of the plurality of unit cells can be acquired by the voltage value acquisition part according to the secondary battery system or secondary battery control method of the present disclosure. As a result, the fluctuations (i.e., the generation of micro short-circuit) between positive and negative values of the total voltage change amount per unit time (ΔV/Δt) of the plurality of unit cells can be observed (S20).

When it is determined that the voltage change amount (ΔV/Δt) is not fluctuating between positive and negative values (S20), i.e., when it is determined that micro short-circuit has not been generated, recovery charging may be maintained at the recovery charging current value ($I_0$) and observation continued, or the recovery charging current value may be increased, recovery charging maintained, and observation continued.

Further, when it is determined that the voltage change amount (ΔV/Δt) is fluctuating between positive and negative values, i.e., when it is determined that micro short-circuit has been generated in at least one of the plurality of unit cells, it is determined whether or not recovery charging has completed (S30). The determination of the completion of recovery charging is not particularly limited and can be appropriately carried out by a person skilled in the art. For example, (i) it may be determined that recovery charging has completed after a prescribed current amount or a prescribed interval has elapsed, (ii) an electric quantity corresponding to the difference (ΔQ=$Q_0$−Q) between the estimated discharge capacity ($Q_0$) in consideration of degradation and the like due to the use described later and the actual discharge capacity (Q), or the electric quantity exceeding this difference (ΔQ) may be determined to determine that recovery charging has completed, or (iii) it may be determined that recovery charging has completed by, in the case in which the current value, which is described later, is continuously observed, comparing the value (∫Idt) obtained by integrating the current value of recovery charging over time and the difference (ΔQ) between the estimated discharge capacity ($Q_0$) and the actual discharge capacity (Q). Furthermore, in the case of recovery charging can be completed when the value (∫Idt) obtained by integrating the current value of recovery charging over time becomes this difference (ΔQ).

Note that when it is determined that recovery charging has not completed (S30), i.e., when trying to stabilize the micro short-circuit generated in at least one of the plurality of unit cells, control may be performed while observing the total voltage value (V) of the plurality of unit cells in some embodiments.

More specifically, it is determined whether or not the total voltage value (V) of the plurality of unit cells exceeds the predetermined first voltage value ($V_1$) (S40). When the voltage value (V) has become higher than the predetermined first voltage value ($V_1$), the recovery charging current value is decreased to the first current value ($I_1$) and recovery charging is maintained (S41). Thereafter, the routine may continuously return to the step (S20) in which the generation of micro short-circuit is observed. Provided that it satisfies $I_{lim} < I_1 < I_0$.

The predetermined first voltage value ($V_1$) can be set to a value obtained by multiplying a voltage value at which the state of charge (SOC) of a single unit cell does not exceed 100% by the number of unit cells to be charged. For example, the predetermined first voltage value ($V_1$) may be a value obtained by multiplying a voltage value (Va) when the SOC of a single unit cell is 100% or less, 99% or less, 95% or less, 90% or less, 85% or less, 80% or less, 70% or less, 60% or less, 50% or less, 40% or less, 30% or less, or 20% or less by the number (n) of unit cells to be charged (Va×n).

Furthermore, when the total voltage value (V) of the plurality of unit cells does not exceed the predetermined first voltage value ($V_1$), it is determined whether or not the total voltage value (V) has become lower than the predetermined second voltage value ($V_2$) (S50). When the total voltage value (V) has become lower than the predetermined second voltage value ($V_2$), the recovery charging current value is increased to the second current value ($I_2$) and recovery charging is maintained (S51). Thereafter, the routine may continuously return to the step (S20) in which the generation of micro short-circuit is observed. Provided that it satisfies $I_0 < I_2$.

Furthermore, when the total voltage value (V) of the plurality of unit cells does not exceed the predetermined first voltage value ($V_1$) and is higher than the second voltage value ($V_2$), it can be determined that the micro short-circuit has been stabilized. In this case, the routine may continuously return to the step (S20) in which the generation of micro short-circuit is observed.

The predetermined second voltage value ($V_2$) can be set to a value in a range in which micro short-circuit can be generated and which is lower than the predetermined first voltage value ($V_1$). For example, the predetermined second voltage value ($V_2$) may be a value obtained by multiplying a voltage value (Vb) when the SOC of a single unit cell is 10% or more, 20% or more, 30% or more, 40% or more, 50% or more, 55% or more, 60% or more, 65% or more, 70% or more, 75% or more, or 80% or more by the number (n) of unit cells to be charged (Vb×n).

Note that the method for determining the voltage value corresponding to the percentage of the state of charge (SOC) is not particularly limited and can be appropriately performed by a person skilled in the art. For example, the voltages Va and Yb corresponding to the first voltage value ($V_1$) and the second voltage value ($V_2$), respectively, can be obtained from the relationship between the state of charge (SOC) and open circuit voltage (OCV) of a single unit cell. Further, the values obtained by multiplying Va and Vb by the number of unit cells to be used can be determined as the first voltage value ($V_1$) and the second voltage value ($V_2$), respectively.

Further, in some embodiments the secondary battery system and secondary battery control method of the present disclosure further comprise a voltage value acquisition part, a current value acquisition part, and a temperature acquisition part for acquiring, a total voltage value (V), a current value (I), and a temperature (T) of the plurality of unit cells, respectively, and an operation part for calculating a total actual discharge capacity (Q) of the plurality of unit cells from the voltage value, the current value, and the temperature, and wherein when the total actual discharge capacity becomes lower than a predetermined value, the controller performs the recovery charging. As a result, when the total actual discharge capacity (Q) becomes lower than a predetermined value, i.e., when variation in the state of charge between the plurality of unit cells become large, the recovery charging controller can perform recovery charging if necessary.

Figure 5:
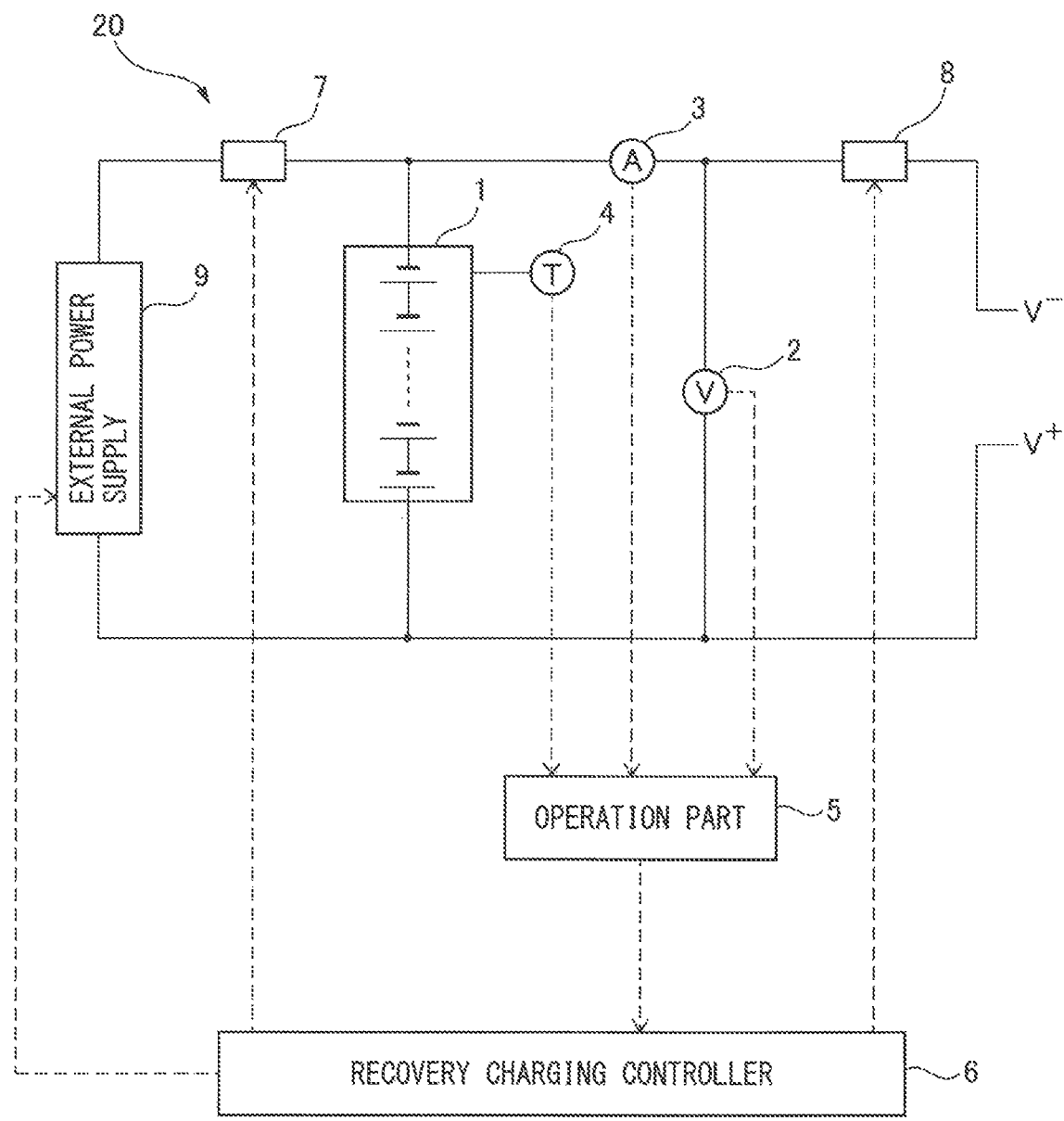
FIG. 5 is a schematic view showing an embodiment of the configuration of the secondary battery system of the present disclosure.

For example, FIG. 5 is a schematic view showing an embodiment of the secondary battery system of the present disclosure. As shown in FIG. 5, the secondary battery system 20 of the present disclosure includes an all-solid-state lithium secondary battery 1 composed of a plurality of unit cells 1a, 1b, . . . , 1x, and 1y connected in series, a voltage value acquisition part 2, a current value acquisition part 3, and a temperature acquisition part 4 for acquiring the total voltage value (V), the current value (I), and the temperature (T) of the all-solid-state lithium secondary battery 1, respectively, an operation part 5 for calculating the total actual discharge capacity (Q) of the all-lithium secondary battery 1 from the voltage value (V), current value (I), and temperature (T), and a recovery charging controller 6. When the total actual discharge capacity (Q) of the all-solid-state lithium secondary battery 1 becomes lower than a predetermined value, the recovery charging controller 6 performs recovery charging. Furthermore, as described above, the recovery charging controller 6 switches off a switch 8 between the all-solid-state lithium secondary battery and the load, and switches on the switch 7 between the all-solid-state lithium secondary battery 1 and the external power supply 9, whereby recovery charging can be executed.

In the present disclosure, the "predetermined value" of the actual discharge capacity (Q) is not particularly limited and can be set as, for example, the estimated discharge capacity ($Q_0$) in consideration of degradation due to use, etc. Furthermore, when the relationship between the actual discharge capacity (Q) and the estimate discharge capacity ($Q_0$) is represented by the difference ($\Delta Q = Q_0 - Q$), "when the actual discharge capacity (Q) becomes lower than a predetermined value" can be determined as "when the difference ($\Delta Q$) becomes higher than a predetermined value". In other words, in some embodiments of the secondary battery system and the secondary battery control method of the present disclosure, the step of recovery charging (S10) may be performed after it has been determined whether or not this difference ($\Delta Q$) is higher than a predetermined value. Furthermore, the "predetermined value" related to this difference ($\Delta Q$) is not particularly limited and can be appropriately set by a person skilled in the art.

Furthermore, the above embodiment of the present disclosure will be described in further detail following the flowchart shown in FIG. 6.

Figure 6:
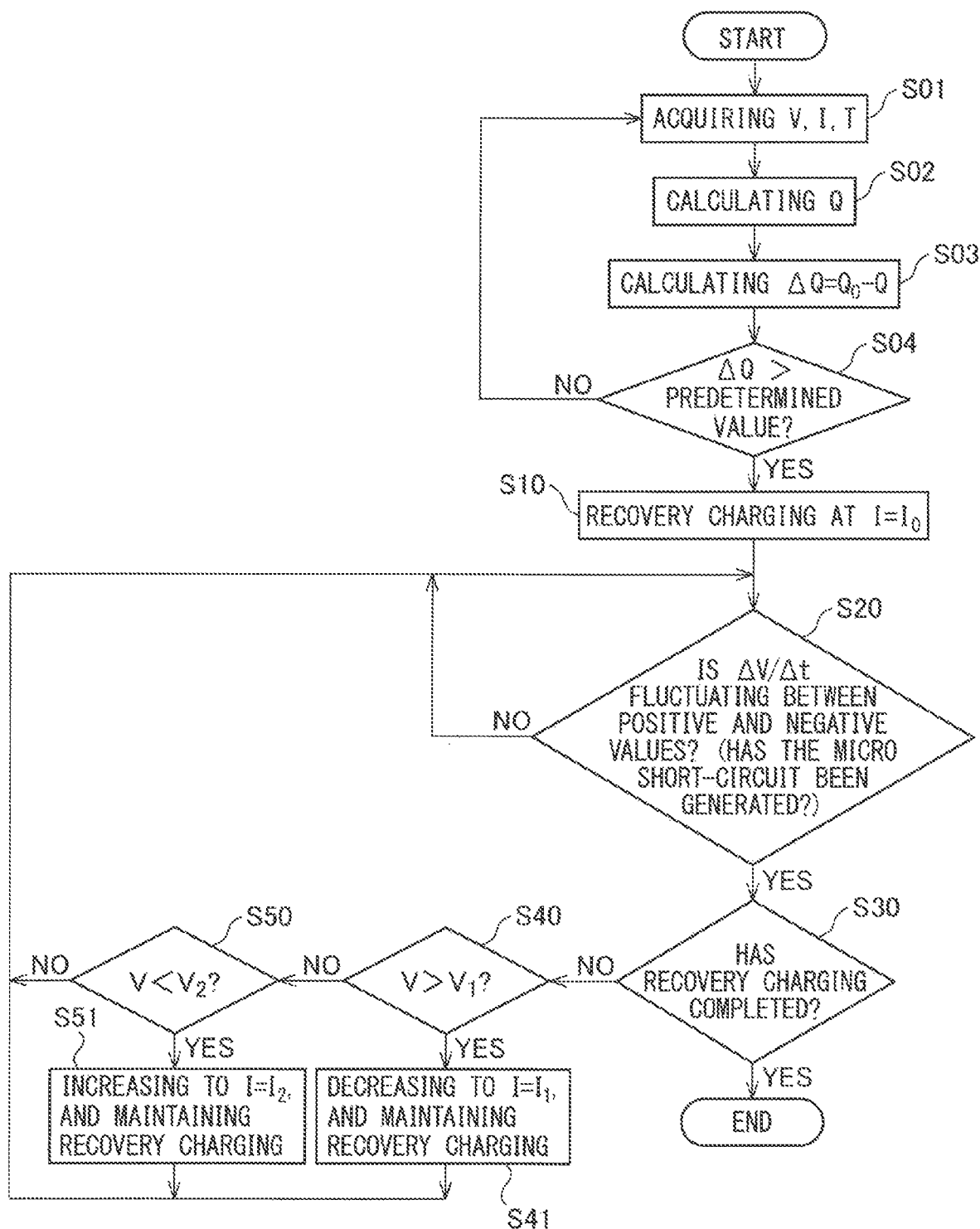
FIG. 6 is a flowchart showing an embodiment of the secondary battery system and secondary battery control method of the present disclosure.

FIG. 6 is a flowchart showing an embodiment of the secondary battery system and secondary battery control method according to the present disclosure.

As shown in FIG. 6, after use of the secondary battery system of the present disclosure or the secondary battery control method of the present disclosure is started, the total voltage value (V), current value (I), and temperature 07) of the plurality of unit cells are acquired by the voltage value acquisition part, the current value acquisition part, and the temperature acquisition part (S01).

Next, in the operation part, the actual discharge capacity (Q) of the plurality of unit cells is calculated from the above acquired voltage value (V), current value (I), and temperature (T) (S02).

Further, the difference ($\Delta Q = Q_0 - Q$) between the estimated discharge capacity ($Q_0$) and the actual discharge capacity (Q) is calculated (S03).

When it is determined that this difference ($\Delta Q$) exceeds a predetermined value (S04), i.e., when it is determined that variation in the state of charge between the plurality of unit cells has been generated, control from the aforementioned step S10 can be performed. Note that the controls of the steps from S10 and thereafter are the same as in the flowchart shown in FIG. 4 described above, and an explanation thereof has been omitted.

Furthermore, when it is determined that this difference ($\Delta Q$) has not exceeded a predetermined value (S04), i.e., when it is determined that variation in the state of charge between the plurality of unit cells, has not been generated, the routine continuously returns to the step (S01) in which the voltage value (V), current value (I), and temperature (T) are acquired and observation of the plurality of unit cells connected in series, can continue.

<First Additional Control>

The secondary battery system and secondary battery control method of the present disclosure can further include a first additional control in which it is determined whether the reduction in the total amount of available electricity is due to variation in the state of charge between the plurality of unit cells or due to degradation of individual unit cells.

In other words, the secondary battery system and secondary battery control method of the present disclosure further comprises, as a first additional control, a degradation determination part for determining degradation of the plurality of unit cells, wherein after recovery charging has been performed, the operation part calculates a total actual discharge capacity of the plurality of unit cells after recovery charging, and wherein when the difference between the total actual discharge capacity after the recovery charging and the total actual discharge capacity before the recovery charging is lower than a predetermined value, the degradation determination part determines that at least one of the plurality of unit cells has degraded.

When the reduction in the total amount of available electricity of the plurality of unit cells is due to variation in the state of charge between the plurality of unit cells, this variation can be minimized or eliminated by the secondary battery system and secondary battery control method of the present disclosure, whereby the total charge/discharge capacity can be recovered. However, when the reduction in the total amount of available electricity of the plurality of unit cells is due to degradation of individual unit cells, the total charge/discharge capacity cannot be recovered by the secondary battery system and secondary battery control method of the present disclosure, and further degradation of the individual unit cells would be caused by excessive repeated charging.

Thus, by determining whether the reduction in the total amount of available electricity is due to the generation of variation in the state of charge between the plurality of unit cells or degradation in individual unit cells using this first additional control, it is possible to prevent the secondary battery system and the secondary battery control method of the present disclosure from being excessively performed, thereby preventing further degradation of the unit cells.

In the present disclosure, this first additional control can be performed after the process in which the state of charge is recovered by the system and method of the present disclosure following the aforementioned flowchart shown in FIG. 6, which shows an embodiment of the secondary battery system and secondary battery control method of the present disclosure.

Figure 7:
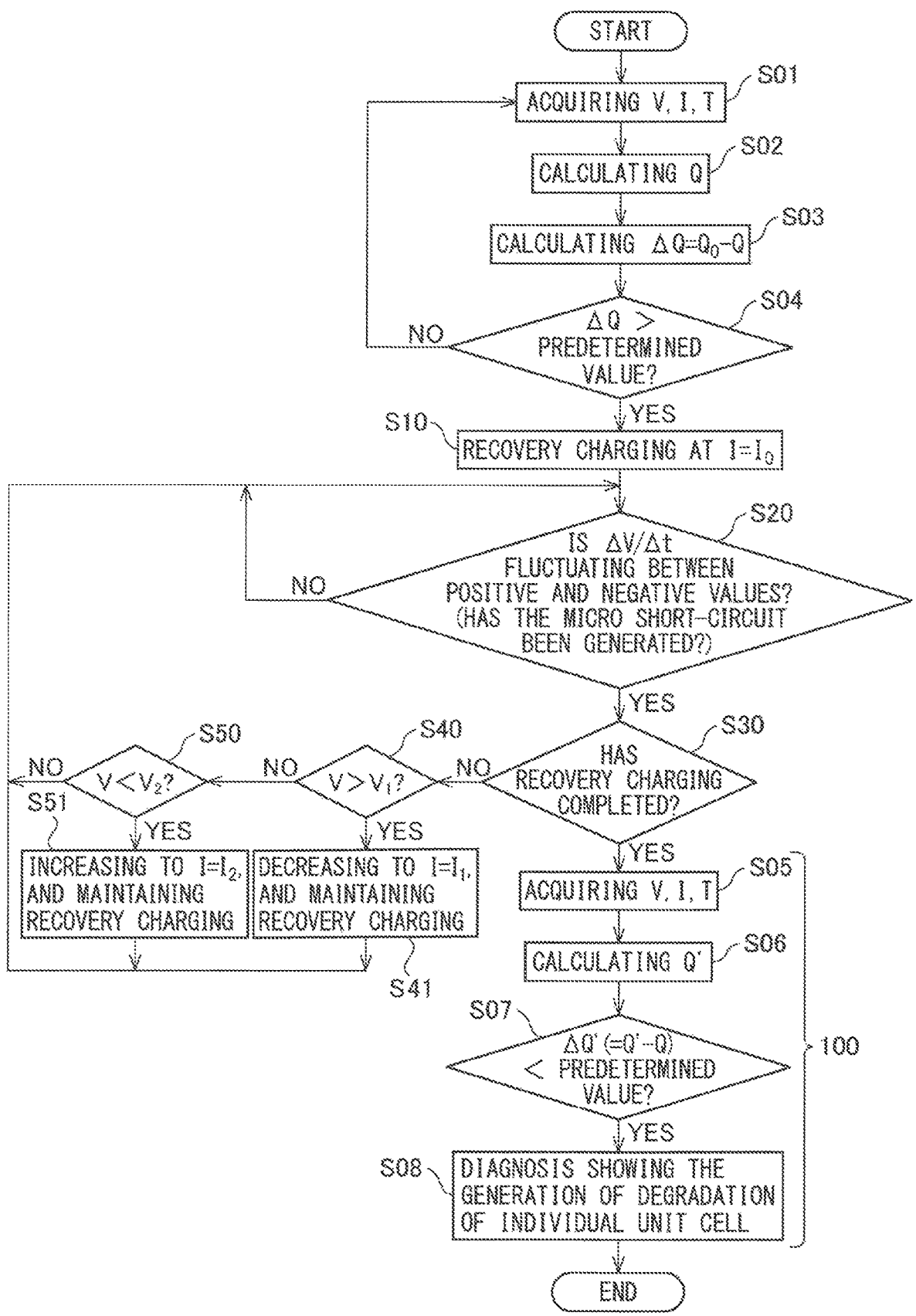
FIG. 7 is a flowchart showing an embodiment of a first additional control according to the present disclosure.

More specifically, as shown in FIG. 7, in this first additional control 100, the total voltage value (V), the current value (I), and the temperature (T) are acquired (S05) after the process (S30) in which the state of charge is recovered by the system and method of the present disclosure following the aforementioned flowchart shown in FIG. 6, which shows an embodiment of the secondary battery system and the secondary battery control method of the present disclosure. Further, the total actual discharge capacity (Q') of the plurality of unit cells after recovery charging is calculated (S06). The total actual discharge capacity (Q) before recovery charging can be acquired by the aforementioned calculation step (S02). Next, the difference ($\Delta Q'=Q'-Q$) between the total actual discharge capacity (Q') after recovery charging and the total actual discharge capacity (Q) before recovery charging is calculated, and the relationship between this difference ($\Delta Q'$) and a predetermined value is confirmed (S07). When this difference ($\Delta Q'$) is lower than a predetermined value, in other words, when the total capacity of the plurality of unit cells was not significantly recovered by the system and method of the present disclosure, it can be determined that the total battery capacity was decreased due to degradation of at least one unit cell. In this case, a diagnosis showing the generation of degradation of at least one unit cell can be displayed. Conversely, a difference ($\Delta Q'$) which is higher than the predetermined value means that the recovery process was achieved by the secondary battery system and the secondary battery control method of the present disclosure. Note that the "predetermined value" related to this difference ($\Delta Q'$) is not particularly limited and can be appropriately set by a person skilled in the art.

<Second Additional Control>

Furthermore, the secondary battery system and secondary battery control method of the present disclosure can further comprise a second additional control in which it is determined whether or not dead short circuit has been generated in any of the plurality of unit cells when the aforementioned micro short-circuit is generated.

In other words, the secondary battery system and secondary battery control method of the present disclosure further comprises, as a second additional control, a short-circuit determination part for determining whether if a short-circuit has been generated in the plurality of unit cells, wherein after the recovery charging controller has increased the recovery charging current value, the voltage value acquisition part acquires a total voltage value of the plurality of unit cells after the increase in recovery current value, and wherein when the total voltage value after the increase in recovery current value is equal to or lower than the predetermined second voltage value, the short-circuit determination part determines that a short-circuit has been generated in at least one of the plurality of unit cells.

When the plurality of unit cells are charged at a predetermined recovery charging current value which is higher than the upper limit current value during normal charging, it is considered that it is possible that a dead short circuit could be generated in any unit cells among the plurality of unit cells due to, for example, an error in the setting of the predetermined recovery charging current value or the state of the unit cells used. The generation of such a dead short circuit may lead to a large reduction in the performance of the all-solid-state lithium secondary battery. Thus, it can be determined that dead short circuit has been generated in some unit cells among the plurality of unit cells by performing this second additional control.

Figure 8:
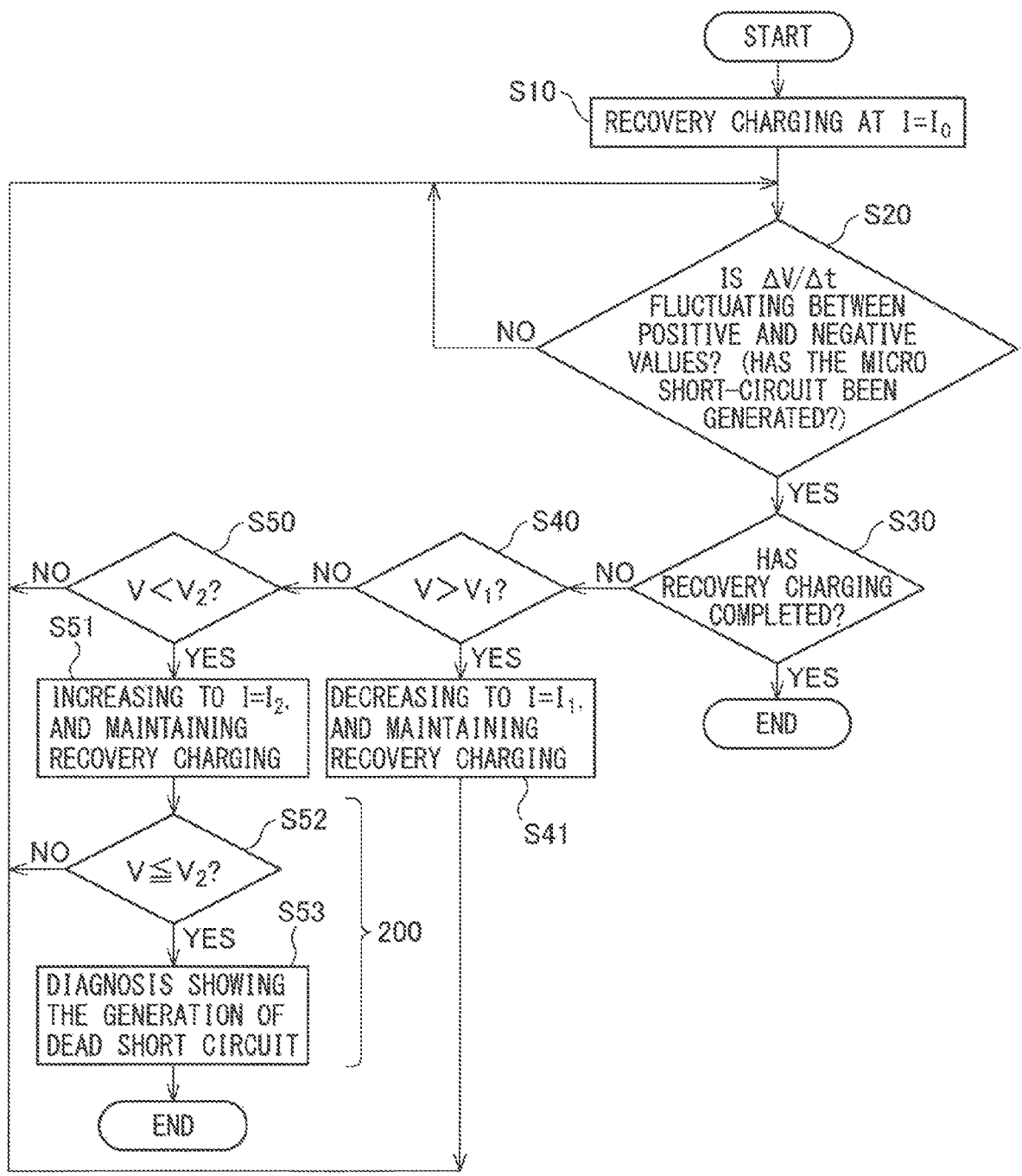
FIG. 8 is a flowchart showing an embodiment of a second additional control according to the present disclosure.

A specific example of this second additional control will be described using FIG. 8. In other words, when the process in which the state of charge is recovered by the system and method of the present disclosure is performed, when the total voltage value (V) of the plurality of unit cells is lower than the predetermined second voltage value ($V_2$), the recovery charging current value is increased to the second current value ($I_2$), and recovery charging is maintained (S51). Thereafter, the second additional control 200 includes a step (S52) in which the voltage value acquisition part acquires the total voltage value (V) of the plurality of unit cells after the increase in the recovery current value and compares this total voltage value (V) after the increase in recovery current value and the predetermined second voltage value ($V_2$). When the total voltage value (V) after the increase in the recovery current value is equal to or lower than the predetermined second voltage value ($V_2$), a diagnosis showing that dead short circuit has been generated can be displayed (S53). Conversely, when the recovery charging current value is increased to the second current value ($I_2$), the recovery charging is maintained, and the total voltage value (V) after the increase in, the recovery current value becomes higher than the second voltage value ($V_2$), i.e., when it is determined that the micro short-circuit has been stabilized, the routine may continuously return to the step (S20) in which the generation of micro short-circuit is observed.

«CONFIGURATION OF THE UNIT CELLS»

In the present disclosure, the unit cells are all-solid-state lithium secondary battery unit cells. Such plurality of unit cells are connected in series. The term "plurality" indicates a number equal to or greater than two. In the present disclosure, the upper limit of the number of unit cells is not particularly limited and can be set appropriately based on the necessary output.

The configuration of the unit cells is not particularly limited and may be set in accordance with the intended application or purpose. For example, the all-solid-state unit cell may each be composed by laminating a positive electrode current collector layer, a positive electrode active material layer, a solid electrolyte layer, a negative electrode active material layer, and a negative electrode current collector layer in this order.

Furthermore, from the viewpoint of more remarkably exhibiting the effect of the present disclosure, in the secondary battery and the secondary battery control method of the present disclosure, the plurality of unit cells connected in series, may form a bipolar-type laminated battery in some embodiments. Bipolar-type laminated battery is a battery in which laminates, each including a current collector layer, a positive electrode active material layer included on a side surface of the current collector layer, and a negative electrode active material layer included on the opposite side surface, are laminated a plurality of times via electrolyte layers.

Furthermore, the constituent members of the positive electrode current collector layer, the positive electrode active material layer, the solid electrolyte layer, the negative electrode active material layer, and the negative electrode current collector layer are not particularly limited and any members which can be used in all-solid-state battery can be used. Examples of these members will be described below.

<Current Collector Layer>

The current collector layer is laminated on the surface of the active material layer opposite the surface of the active material layer on which the solid electrolyte layer is laminated. When the active material layer is the positive electrode active material layer, the current collector layer laminated thereon is the positive electrode current collector layer. When the active material layer is the negative electrode active material layer, the current collector layer laminated thereon is the negative electrode current collector layer. Furthermore, when the all-solid-state battery laminate is of a bipolar-type, a positive electrode/negative electrode current collector layer can be used. The term "positive electrode/negative electrode current collector layer" means a member which can fulfill the role of either electrode (the positive electrode or the negative electrode). Specifically, in the case of a bipolar-type all-solid-state battery laminate, the term "positive electrode/negative electrode current collector layer" means a current collector layer which can serve as both a positive electrode active material layer and a negative electrode active material layer.

Examples of the material constituting the positive electrode current collector layer, the negative electrode current collector layer, and the positive electrode/negative electrode current collector layer are not particularly limited, and various metals such as silver, copper, gold, aluminum, nickel, iron, stainless steel (SUS), titanium, and alloys thereof can be used. From the viewpoint of chemical stability, an aluminum current collector layer may be used as the positive electrode current, collector layer in some embodiments, a copper current collector layer may be used as the negative electrode current collector layer in some embodiments, and SUS may be used as the positive electrode/negative electrode current collector layer in some embodiments.

Furthermore, the forms of the current collector layers are not particularly limited and can be, for example, foil-like, plate-like, mesh-like, etc.

<Positive Electrode Active Material Layer>

The positive electrode active material layer includes at least a positive electrode active material and, in some embodiment, may further include a solid electrolyte, which is described later. In addition thereto, additives which are used for the positive electrode active material layers of all-solid-state batteries, such as a conductive aid or a binder, can be used in accordance with the intended application or intended use.

(Positive Electrode Active Material)

The material of the positive electrode active material, used in the present disclosure is not particularly limited and any known material can be used. For example, the positive electrode active material may be lithium cobalt oxide (LiCoO$_2$), lithium nickel oxide (LiNiO$_2$), manganate (LiMn$_2$O$_4$), LiCo$_{1/3}$Ni$_{1/3}$Mn$_{1/3}$O$_2$, or an Li—Mn spinel substituted with a different element having a composition represented by LI$_{1+x}$Mn$_{2-x-y}$M$_y$O$_4$ (wherein M is one or more metal elements selected from Al, Mg, Co, Fe, Ni, and Zn) or a sulfide type (Li$_x$S or Li$_x$MS$_2$ (wherein M is Fe, Ti, etc.)). However, the material of the positive electrode active material is not limited to these materials.

(Conductive Aid)

The conductive aid is not particularly limited and any known conductive aid can be used. For example, the conductive aid may be a carbon material such as VGCF (Vapor Grown Carbon Fiber) or carbon nanofibers, a metal material, or the like. However, the conductive aid is not limited to these materials.

(Binder)

The binder is not particularly limited and any known binder can be used. For example, the binder may be a material such as polyvinylidene fluoride (PVdF), carboxy methyleellulose (CMC), butadiene rubber (BR), styrene butadiene rubber (SBR), or combinations thereof. However, the binder is not limited to these materials.

<Solid Electrolyte Layer>

The solid electrolyte layer includes at least a solid electrolyte. The solid electrolyte is not particularly limited and any material used as the solid electrolyte of an all-solid-state battery can be used. For example, the solid electrolyte may be a known sulfide solid electrolyte or a known oxide solid electrolyte. However, the solid electrolyte is not limited to these materials.

(Sulfide Solid Electrolyte)

Examples of the sulfide solid electrolyte include sulfide-based amorphous solid electrolytes, sulfide-based crystalline solid electrolytes, or aldylodite-type solid electrolytes. However, the sulfide solid electrolyte is not limited to these materials. Specific examples of the sulfide solid electrolyte include Li$_2$S—P$_2$S$_5$-type compounds (such as Li$_7$P$_3$S$_{11}$, Li$_3$PS$_4$, or Li$_8$P$_2$S$_9$), Li$_2$S—SiS$_2$, LiI—Li$_2$S—SiS$_2$, LiI—Li$_2$S—P$_2$S$_5$, LiI—LiBr—Li$_2$S—P$_2$S$_5$, Li$_2$S—P$_2$S$_5$—GeS$_2$ (such as Li$_{13}$GeP$_3$S$_{16}$ or Li$_{10}$GeP$_2$S$_{12}$), LiI—Li$_2$S—P$_2$O$_5$, LiI—Li$_3$PO$_4$—P$_2$S$_5$, Li$_{7-x}$PS$_{6-x}$Cl$_x$, or combinations thereof. However, the sulfide solid electrolyte is not limited to these materials.

Note that, as an example of the generation at "micro short-circuit" in the present disclosure, from the viewpoint that the reaction between sulfide and lithium can be used for micro short-circuit, in some embodiments a sulfide solid electrolyte may be used as the solid electrolyte Which can be included in the aforementioned positive electrode active material layer and solid electrolyte layer, and the negative electrode active material layer, which is described later.

When a sulfide solid electrolyte is included in the positive electrode active material layer, the solid electrolyte layer, and the negative electrode active material layer, a Li$^+$+e$^-$→Li reaction can occur in the negative electrode active material layer. Furthermore, in the positive electrode active material layer, a Li$_2$S→2Li$^+$+2e$^-$+S reaction can occur. The "micro short-circuit" of the present disclosure described above can be generated accompanying the 2Li$^+$S→Li$_2$S reaction when the lithium deposits from the negative electrode active material layer and comes into contact with the positive electrode active material layer. In this way, the use of a sulfide solid electrolyte facilitates easy generation of "micro short-circuit", in some embodiments of the secondary battery system and the secondary battery control method of the present disclosure. However, the "generation" of "micro short-circuit" is not limited only to when this sulfide solid electrolyte is used, and it can be arbitrarily adopted from substances which can react with lithium.

(Oxide Solid Electrolyte)

Examples of the oxide solid electrolyte include $Li_7La_3Zr_2O_{12}$, $Li_{7-x}La_3Zr_{1-x}Nb_xO_{12}$, $Li_{7-3x}La_3Zr_2Al_xO_{12}$, $Li_{3x}La_{2/3-x}TiO_3$, $Li_{1+x}Al_xTi_{2-x}(PO_4)_3$, $Li_{1+x}Al_xGe_{2-x}(PO_4)_3$, $Li_3PO_4$, $Li_{3+x}PO_{4-x}N_x$ (LiPON) polyethylene oxide (PEO), polypropylene oxide (PPO), or combinations thereof. However, the oxide solid electrolyte is not limited to these materials.

The solid electrolyte may be a glass or may be a crystallized glass (glass ceramic).

Furthermore, other than the aforementioned solid electrolyte, the solid electrolyte layer may include a binder or the like as necessary. Specific examples of the binder are the same as the "binders" recited in "POSITIVE ELECTRODE ACTIVE MATERIAL LAYER", and accordingly, an explanation thereof has been omitted.

<Negative Electrode Active Material Layer>

The negative electrode active material layer includes at least a negative electrode active material and, in some embodiments, may further include the aforementioned solid electrolyte. In addition thereto, additives such as a conductive aid or binder, which are used in the negative electrode active material layers of all-solid-state batteries, can be included in accordance with the intended application or the intended use.

(Negative Electrode Active Material)

The material of the negative electrode active material used in the present disclosure is not particularly limited and may be a material which is capable of releasing and occluding lithium ions in some embodiments. For example, metals such as Li, Sn, Si, and In, alloys of lithium and titanium, or carbon materials such as hard carbon, soft carbon, or graphite may be used. However, the negative electrode active material is not limited to these materials.

(Additives)

As additives other than the solid electrolyte, conductive aid, and binder used in the negative electrode active material layers, the additives described regarding the positive electrode active material layer and the solid electrolyte layer may be appropriately used.

REFERENCE SIGNS LIST 1 all-solid-state lithium secondary battery
1a, 1b, 1x, 1y unit cell
2 voltage value acquisition part
3 current value acquisition part
4 temperature acquisition part
5 operation part
6 recovery charging controller
7, 8 switch
9 external power supply
10, 20 secondary battery system
100 first additional control
200 second additional control

The invention claimed is:

1. A secondary battery system comprising:
a plurality of unit cells connected in series, the plurality of unit cells are all-solid-state lithium secondary battery unit cells,
a voltage value acquisition part for acquiring a total voltage value of the plurality of unit cells and
a recovery charging controller that performs recovery charging of charging the plurality of unit cells, while generating a micro short-circuit in at least one of the plurality of unit cells by charging the plurality of unit cells, at a predetermined recovery charging current value which is higher than a upper limit current value during normal charging, and during the recovery charging, when the total voltage value becomes higher than a predetermined first voltage value, the recovery charging controller decreases the recovery charging current value, and when the total voltage value becomes lower than a predetermined second voltage value, the recovery charging controller increases the recovery charging current value, whereby the recovery charging is maintained.

2. The secondary battery system according to claim 1, wherein the system further comprises a short-circuit determination part for determining whether if a short-circuit has been generated in the plurality of unit cells, wherein after the recovery charging controller has increased the recovery charging current value, the voltage value acquisition part acquires a total voltage value of the plurality of unit cells after the increase in recovery current value, and
wherein when the total voltage value after the increase in recovery current value is equal to or lower than the predetermined second voltage value, the short-circuit determination part determines that a short-circuit has been generated in at least one of the plurality of unit cells.

3. The secondary battery system according to claim 1, wherein the system further comprises:
a voltage value acquisition part, a current value acquisition part, and a temperature acquisition part for acquiring a total voltage value, a current value, and a temperature of the plurality of unit cells, respectively, and
an operation part for calculating a total actual discharge capacity of the plurality of unit cells from the voltage value, the current value, and the temperature, and
wherein when the total actual discharge capacity becomes lower than a predetermined value, the recovery charging controller performs the recovery charging.

4. The secondary battery system according to claim 3, wherein the system further comprises a degradation determination part for determining degradation of the plurality of unit cells,
wherein after recovery charging has been performed, the operation part calculates a total actual discharge capacity of the plurality of unit cells after recovery charging, and
wherein when the difference between the total actual discharge capacity after the recovery charging and the total actual discharge capacity before the recovery charging is lower than a predetermined value, the degradation determination part determines that at least one of the plurality of unit cells has degraded.

5. The secondary battery system according to claim 1, wherein the plurality of unit cells connected in series form a bipolar-type laminated battery.

6. A secondary battery control method comprising:

performing recovery charging of charging a plurality of unit cells connected in series, while generating a micro short-circuit in at least one of the plurality of unit cells by charging the plurality of unit cells, at a predetermined recovery charging current value which is higher than a upper limit current value during normal charging, acquiring a total voltage value of the plurality of unit cells, and maintaining the recovery charging by, during the recovery charging, decreasing the recovery charging current value when the total voltage value becomes higher than a predetermined first voltage value, and increasing the recovery charging current value when the total voltage value becomes lower than a predetermined second voltage value, wherein the unit cells are all-solid-state lithium secondary battery unit cells.

7. The method according to claim 6, further comprising:

acquiring, after the recovery charging current has been increased, a total voltage value of the plurality of unit cells after the increase in recovery current value, and determining that a short-circuit has been generated in at least one of the plurality of unit cells, when the total voltage value after the increase in recovery current value is equal to or lower than the predetermined second voltage value.

8. The method according to claim 6, further comprising:

acquiring a total voltage value, a current value, and a temperature of the plurality of unit cells, respectively, calculating a total actual discharge capacity of the plurality of unit cells from the voltage value, the current value, and the temperature, and performing the recovery charging when the total actual discharge capacity becomes lower than a predetermined value.

9. The method according to claim 8, further comprising:

calculating, after the recovery charging has been performed, a total actual discharge capacity for the plurality of unit cells after recovery charging, and determining that at least one of the plurality of unit cells has degraded, when the difference between the total actual discharge capacity after the recovery charging and the total actual discharge capacity before the recovery charging is lower than a predetermined value.

10. The method according to claim 6, wherein the plurality of unit cells connected in series form a bipolar-type laminated battery.

* * * * *